(12) United States Patent
North et al.

(10) Patent No.: US 10,775,861 B2
(45) Date of Patent: Sep. 15, 2020

(54) APPARATUS AND METHOD TO IMPROVE THERMAL MANAGEMENT FOR ONE OR MORE HEAT GENERATING COMPONENTS WITHIN AN INFORMATION HANDLING SYSTEM

(71) Applicant: DELL PRODUCTS L.P., Round Rock, TX (US)

(72) Inventors: Travis C. North, Cedar Park, TX (US); Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 95 days.

(21) Appl. No.: 16/134,272

(22) Filed: Sep. 18, 2018

(65) Prior Publication Data

US 2020/0089292 A1    Mar. 19, 2020

(51) Int. Cl.
*F25B 29/00*        (2006.01)
*G06F 1/20*         (2006.01)
*H05K 7/20*         (2006.01)

(52) U.S. Cl.
CPC ........... *G06F 1/206* (2013.01); *H05K 7/2039* (2013.01); *H05K 7/20336* (2013.01)

(58) Field of Classification Search
CPC .... F28F 3/022; G05K 7/20336; G05K 7/2039
USPC ....................................................... 165/253
See application file for complete search history.

(56) References Cited

U.S. PATENT DOCUMENTS

2017/0191709 A1*    7/2017   Chen ....................... F28F 3/022

OTHER PUBLICATIONS

North et al., "System and Method of Transferring Energy", U.S. Appl. No. 15/909,014, filed Mar. 1, 2018, 37 pgs.
Bernath, "n: m.2 Heatsinks, Are They Worth It?", Apr. 2018, 15 pgs.
Godfrey, "An Introduction to Thermoelectric Coolers", Electronics Cooling, Sep. 1996, 13 pgs.
Peltier Coolers (TEC), Coldplates, Frozen CPU, Captured From Internet on Mar. 21, 2016, 3 pgs.

* cited by examiner

*Primary Examiner* — Davis D Hwu
(74) *Attorney, Agent, or Firm* — Egan Peterman Enders Huston

(57) ABSTRACT

Apparatuses and methods are provided to improve thermal management for one or more heat generating components within an information handling system (IHS). An embodiment of an apparatus may include a heat pipe, a thermoelectric cooler (TEC), a heat exchanger, a temperature sensor and a controller. The heat pipe is thermally coupled between the heat generating component(s) and the heat exchanger to transfer thermal energy from the one or more heat generating components to the heat exchanger. The TEC is thermally coupled between the heat pipe and the heat exchanger to transfer excess thermal energy that is not absorbed by the heat pipe to the heat exchanger. The temperature sensor measures an internal temperature within the IHS. The controller receives the internal temperature measurement from the temperature sensor and enables/disables the TEC based on the received temperature measurement.

23 Claims, 7 Drawing Sheets

APPARATUS AND METHOD TO IMPROVE THERMAL MANAGEMENT FOR ONE OR MORE HEAT GENERATING COMPONENTS WITHIN AN INFORMATION HANDLING SYSTEM

FIELD OF THE INVENTION

This invention relates generally to information handling systems, and more particularly to an apparatus and method that improves thermal management for heat generating component(s) within an information handling system.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems (IHSs) typically use some form of active and/or passive thermal management to direct heat away from heat generating components contained within the IHS. For example, one or more fans may be included within a chassis or housing of an IHS to provide active cooling to one or more heat generating components contained therein. In another example, heat generating components may be thermally coupled to a heat sink (e.g., a heat exchanger, metal chassis or other thermally conductive component within the IHS), which functions to passively draw heat away from the heat generating components. In some cases, a heat pipe may be coupled to one or more heat generating components for directing heat away to a heat sink, or another active or passive cooling component, of the IHS.

In addition to active and passive cooling, thermal management schemes are often used to slow down, or even shut down, heat sensitive components when temperatures become too great. For example, the clock speed of a processing device (e.g., a central processing unit, CPU, or graphics processing unit, GPU) may be slowed to reduce the amount of heat produced by the processing device. This type of thermal management scheme, referred to as "thermal throttling," helps the processing device to cool down by reducing the operating speed of the device. Thermal throttling may also be used to control the amount of heat generated by other IHS components, such as a platform controller hub (PCH), memory, and solid state storage devices (SSDs).

Some information handling systems, such as portable IHSs (e.g., notebook computers, tablet computers, smart phones, etc.), network devices (e.g., gateways, etc.) and Internet of Things (IoT) devices, may be temporarily or permanently located in hot ambient environments, such as outdoors or inside a hot vehicle, storage cabinet, etc. In some cases, the external ambient temperature in which an IHS is deployed may reach up to 70° C. or more. Such high external ambient temperatures can present significant problems to the operation of these systems if active/passive cooling components and thermal management schemes are unable to reduce internal temperatures below the thermal design power (TDP) of the components contained therein. For this reason, manufactures often provide temperature ratings for operating the system or components contained therein.

For example, a solid-state storage drive (SSD) included within an IHS may have a maximum temperature rating of about 85° C. $T_{case}$ (i.e., the temperature measured at the top of the SSD case or housing) and a thermal throttle temperature rating of about 70° C. $T_{case}$. The read/write speed of the SSD is reduced when the SSD temperature (e.g., $T_{case}$) reaches the thermal throttle temperature rating. Once the maximum temperature rating is reached, the SSD is automatically shut down to prevent permanent damage to the SSD.

At high external ambient temperatures (e.g., 70° C. and above), internal ambient temperature surrounding the SSD can easily exceed the maximum temperature rating of the SSD, often making the storage device the most critical component constraining overall system performance. While various passive cooling techniques (such as coupling the SSD to a heat sink, thermal pad, metal chassis or enclosure of the IHS) have been used in the past to draw heat away from the storage device at lower external ambient temperatures (e.g., temperatures below 70° C.), there are currently no thermal management solutions that enable an SSD to support high external ambient temperatures up to its maximum temperature rating (e.g., 85° C.).

SUMMARY OF THE INVENTION

The following description of various embodiments of apparatuses, information handling systems and related methods is not to be construed in any way as limiting the subject matter of the appended claims.

Generally speaking, the present disclosure provides an improved thermal management solution (e.g., an apparatus and related methods) for one or more heat generating components of an information handling system (IHS). In some embodiments, the improved thermal management solution disclosed herein may enable one or more heat generating components, such as one or more solid-state drives (SSDs), to operate even when the IHS is temporarily or permanently located in hot ambient environments, such as outdoors or inside a hot vehicle, storage cabinet, etc. Some embodiments of the disclosed thermal management solution may enable the heat generating component(s) to operate even when external ambient temperatures (i.e., ambient temperatures outside of the IHS) meet and/or exceed a maximum temperature rating specified for the heat generating component(s).

According to one embodiment, an apparatus is provided to improve thermal management for one or more heat generating components within an information handling system (IHS). Such an apparatus may generally include a heat pipe, a thermoelectric cooler (TEC), a heat exchanger, a temperature sensor and a controller. The heat pipe may be thermally coupled between one or more heat generating components of the IHS and the heat exchanger to transfer thermal energy from the one or more heat generating components to the heat exchanger. The TEC may be thermally coupled between the heat pipe and the heat exchanger to transfer excess thermal energy that is not absorbed by the heat pipe to the heat exchanger. The temperature sensor may be configured to measure an internal temperature within the IHS (e.g., a temperature directly measured from the heat generating components or in a vicinity of the heat generating components). The controller may be coupled to receive the internal temperature measurement from the temperature sensor, and may be configured to enable and disable the TEC based on the received temperature measurement. In one example embodiment, the controller may be configured to enable the TEC when the received temperature measurement is within a second temperature range, and may be configured to disable the TEC when the received temperature measurement is within a first temperature range, which is less than the second temperature range.

In one embodiment, an evaporator section of the heat pipe may be in direct physical contact with the one or more heat generating components, and a condenser section of the heat pipe may be in direct physical contact with heat exchanger. To prevent thermal energy from the heat exchanger from returning through the heat pipe to the one or more heat generating components, the heat pipe may be specifically configured to transfer thermal energy in only one direction, i.e., from the evaporator section to the condenser section of the heat pipe.

In one embodiment, the heat pipe, TEC and heat exchanger may be implemented in a stacked configuration, with the TEC sandwiched between the heat pipe and the heat exchanger. In such an embodiment, the heat pipe may be configured with multiple bends to accommodate a thickness of the TEC. The cool side of the TEC may be in direct physical contact with the evaporator section of the heat pipe, and the hot side of the TEC may be in direct physical contact with the heat exchanger. When a voltage is applied to the TEC, current flow across the junction of semiconductors sandwiched between the two sides of the TEC may cause a temperature difference between the hot and cools sides of the TEC. This temperature differential enables excess heat from the heat pipe to be absorbed by the cool side of the TEC and transferred through the hot side of the TEC to the heat exchanger.

In one embodiment, the temperature sensor may be coupled to a printed circuit board (PCB) included within the IHS and configured to measure an internal ambient temperature in a vicinity of the one or more heat generating components. In another embodiment, the temperature sensor may be included within the one or more heat generating components to provide a direct temperature measurement of the one or more heat generating components.

In one embodiment, the one or more heat generating components and the controller may be coupled to a first PCB included within the IHS, such as a motherboard or system board of the IHS. In another embodiment, the one or more heat generating components and the controller may be coupled to a second PCB, which is coupled to the first PCB. In one example, the second PCB may be an expansion card (e.g., an M.2 card or module), which is included within the IHS and mounted onto (or otherwise coupled to) the motherboard or system board of the IHS.

According to another embodiment, an information handling system including one or more heat generating components, an apparatus coupled to improve thermal management for the one or more heat generating components is provided herein. In one embodiment, the one or more heat generating components may include one or more solid-state drives (SSDs). In one embodiment, the one or more heat generating components may include one or more NAND-based SSDs. It is noted, however, that the apparatus disclosed herein is not limited to cooling SSDs, and could alternatively be used to reduce the temperature of other heat generating components (e.g., one or more processing devices, a platform controller hub, etc.) contained within the IHS. The apparatus included within the IHS may generally be configured as described above.

According to another embodiment, a thermal management method is provided herein for one or more heat generating components of an IHS. In some embodiments, the method may include providing a heat pipe configured to transfer thermal energy from the one or more heat generating components to a heat exchanger, and a TEC configured to transfer excess thermal energy, which is not absorbed by the heat pipe, to the heat exchanger. The heat pipe, TEC and heat exchanger may be generally configured as described above.

In some embodiments, the method may include measuring an internal temperature within the IHS, and enabling and disabling the TEC based on the internal temperature measurement. In one example embodiment, the method may include enabling the TEC when the internal temperature measurement is within a second temperature range, and disabling the TEC when the internal temperature measurement is within a first temperature range, which is less than the second temperature range.

The first and second temperature ranges may be generally depending on the configuration of the heat pipe and the particular heat generating components being cooled. In one embodiment, the first temperature range may include a range of temperatures that can be absorbed by the heat pipe before the TEC is enabled, and the second temperature range may include a range of temperatures, which extend from an upper limit of the first temperature range to at least a maximum temperature rating specified for the one or more heat generating components. In another embodiment, the second temperature range may extend from an upper limit of the first temperature range up to a temperature, which is substantially equal to a maximum temperature rating specified for the one or more heat generating components plus a temperature differential provided by the TEC.

BRIEF DESCRIPTION OF THE DRAWINGS

Other advantages of the invention will become apparent upon reading the following detailed description and upon reference to the accompanying drawings in which.

Figure 1:
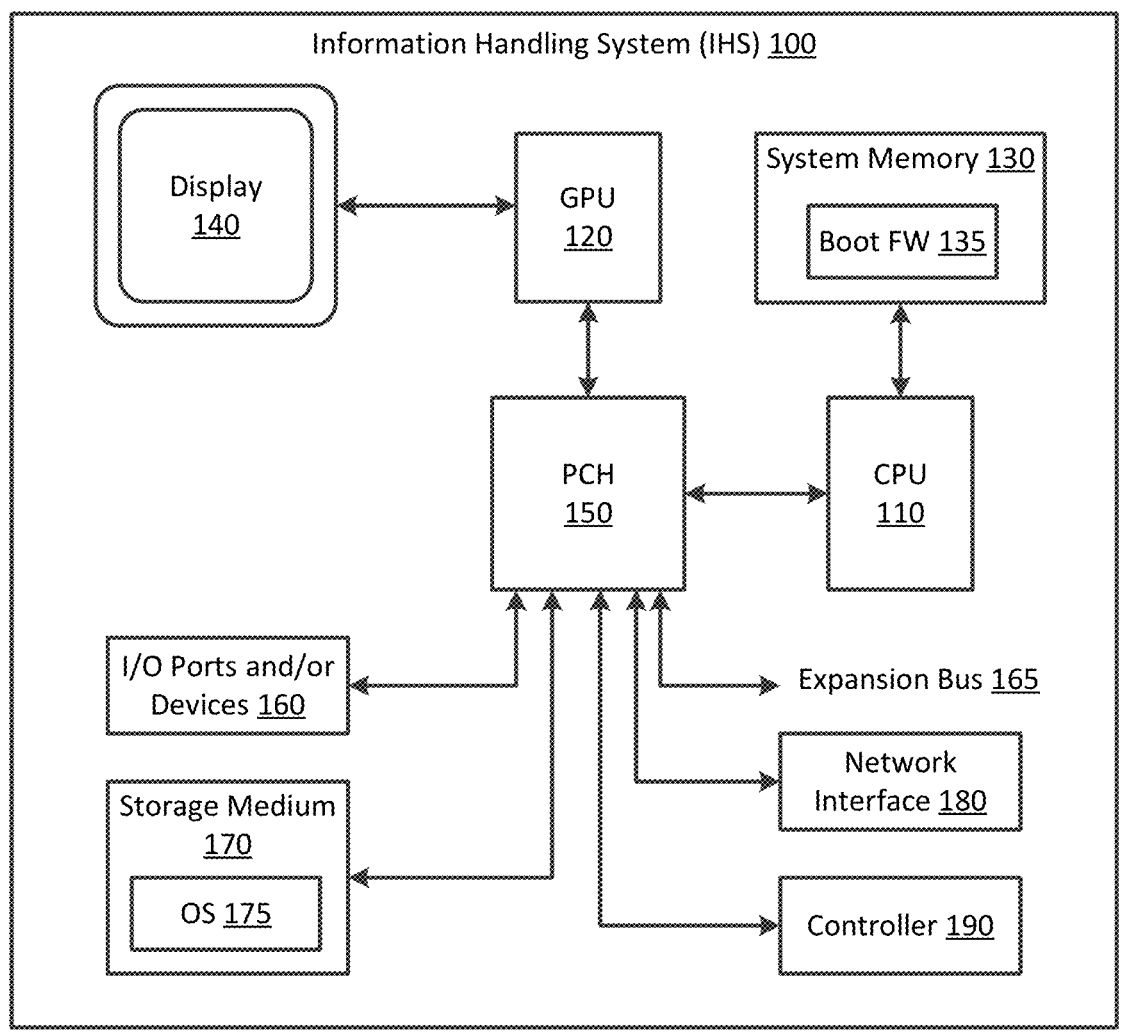
FIG. 1 is a block diagram illustrating one embodiment of an information handling system (IHS) that may use embodiments of the apparatus disclosed herein to improve thermal management for one or more heat generating components contained within the IHS.

While the present disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the present disclosure is to cover all modifications, equivalents and alternatives falling within the spirit and scope of the present disclosure as defined by the appended claims.

DESCRIPTION OF ILLUSTRATIVE EMBODIMENTS

Figure 2:
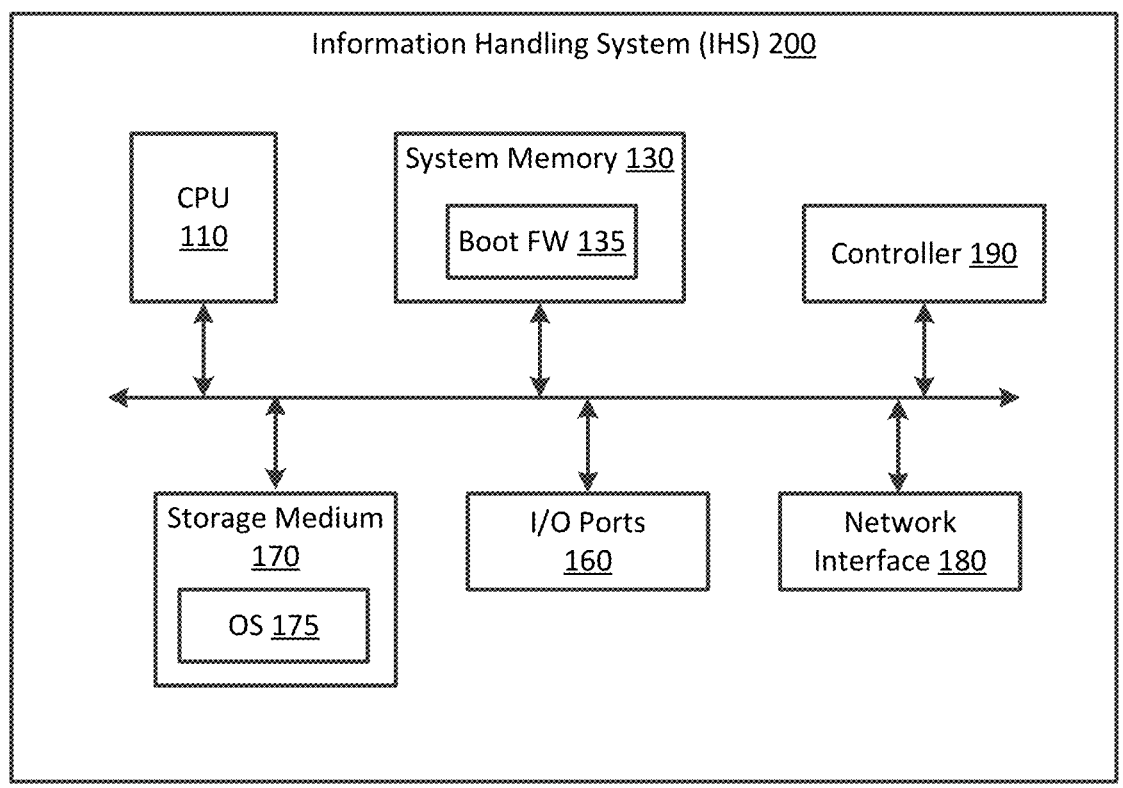
FIG. 2 is a block diagram illustrating another embodiment of an IHS that may use embodiments of the apparatus disclosed herein to improve thermal management for one or more heat generating components contained within the IHS.

FIGS. 1 and 2 are block diagrams of information handling systems 100/200 that may use embodiments of the apparatus disclosed herein to improve thermal management for one or more heat generating components contained within the IHS. In this regard, it will be understood that the IHS configurations shown in FIGS. 1 and 2 are exemplary only, and that the disclosed methods may be implemented on any type of information handling system. It will be further understood that while certain IHS components are shown in FIGS. 1 and 2 for illustrating embodiments of the present disclosure, the information handling system disclosed herein is not restricted to including only those components shown in FIGS. 1 and 2 and described below.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may generally include random access memory (RAM), one or more processing resources such as a central processing unit (CPU) or hardware or software control logic, read only memory (ROM), and/or other types of nonvolatile memory. Additional components of the information handling system may include one or more disk drives, one or more solid state drives (SSDs), one or more network ports for communicating with external devices as well as various input and output (I/O) devices, such as a keyboard, a mouse, touch screen and/or a video display. The information handling system may also include one or more buses operable to transmit communications between the various hardware components.

FIG. 1 illustrates one embodiment of an information handling system 100 (e.g., a desktop computer, notebook computer, tablet computer, smart phone, personal digital assistant (PDA), MP3 player, electronic reader, etc) that may use embodiments of the apparatus disclosed herein to improve thermal management for one or more heat generating components contained within the IHS. As shown in FIG. 1, IHS 100 may generally include at least one processing device, which is configured to execute program instructions (or computer program code) for performing various functions for the IHS. The processing device(s) included within IHS 100 may include various types of programmable integrated circuits (e.g., a processor, controller, microcontroller, microprocessor, ASIC, etc.) and/or programmable logic devices (e.g., a field programmable gate array "FPGA", complex programmable logic device "CPLD", etc.). In the illustrated embodiment, IHS 100 includes central processing unit (CPU) 110 and graphics processor unit (GPU) 120, but may additionally or alternatively include other types of processing devices (e.g., a graphics-derivative processor, a digital signal processor (DSP), etc.) in other embodiments.

CPU 110 may include any type of processing device, such as an Intel Pentium series processor or an Advanced Micro Devices (AMD) processor, having one or more processing cores. As shown in FIG. 1, CPU 110 is communicatively coupled to system memory 130. System memory 130 may include, for example, random access memory (RAM), read only memory (ROM), dynamic RAM (DRAM), synchronous DRAM (SDRAM), and other non-transitory computer readable storage mediums. System memory 130 may be generally configured to store program instructions (or computer program code), which may be executed by CPU 110 for performing various functions for the IHS.

In one embodiment, system memory 130 may contain boot firmware (FW) 135, such as a Basic Input/Output System (BIOS) or a Unified Extensible Firmware Interface (UEFI). As known in the art, boot firmware 135 may include software and/or firmware modules for specifying hardware configuration settings, system time and boot sequence. When IHS 100 is powered on or rebooted, program instructions within boot firmware 135 may be executed by CPU 110 to configure hardware components of the IHS, perform a Power-On Self-Test (POST) to ensure the hardware configuration is valid and working properly, and launch a bootloader to boot at least one operating system (OS) 175 of the IHS. In some embodiments, boot firmware 135 may include additional software and/or firmware modules that may be executed by CPU 110 to perform one or more steps of the thermal management method disclosed herein.

In some embodiments, CPU 110 may be communicatively coupled to a platform controller hub (PCH) 150, which facilitates input/output functions for IHS 100. In FIG. 1, for example, PCH 150 is communicatively coupled between CPU 110 and GPU 120 to provide visual images (e.g., a graphical user interface, static images and/or video content) to display device 140 (e.g., a liquid crystal display (LCD) device or other suitable display device). In some embodiments, input/output (I/O) ports and/or devices 160 (e.g., one or more Ethernet ports, serial ports, general purpose I/O ports, keyboard, mouse, touchpad, touchscreen, etc.) may be coupled to PCH 150 to enable the user to interact with IHS 100, and to interact with application programs or other software/firmware executing thereon. In some embodiments, one or more expansion buses 165 may be coupled to PCH 150 to provide IHS 100 with additional plug-in functionality. Expansion bus(es) 165 may include, but are not limited to, a Peripheral Component Interconnect (PCI) bus, PCI Express bus, Serial Advanced Technology Attachment (SATA) bus, Universal Serial Bus (USB) or any other suitable expansion bus.

Storage medium 170 is coupled to PCH 150 to provide permanent storage for IHS 100, and may be generally configured to store at least one operating system (OS) 175 for the IHS. When the IHS is powered on or rebooted, a boot loader within boot firmware 135 is executed to retrieve OS 175 from storage medium 170 and load it into system memory 130. Once loaded into system memory 130, program instructions (or computer program code) within OS 175 may be executed by CPU 110 to perform various tasks and functions for the information handling system. In some embodiments, OS 175 may include additional program instructions (e.g., OS drivers), which may be executed by CPU 110 to perform one or more steps of the thermal management method disclosed herein.

Figure 3:
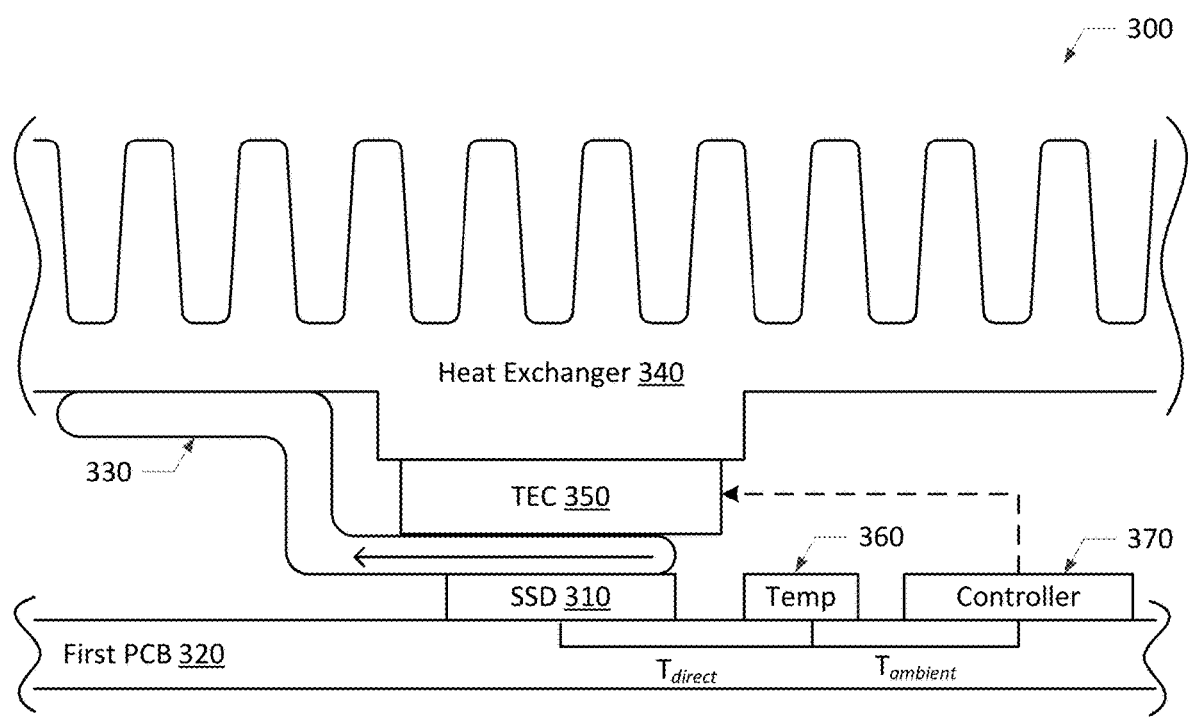
FIG. 3 is a block diagram illustrating one embodiment of an apparatus that may be included within an IHS to improve thermal management for a solid-state drive (SSD), which is coupled to a first printed circuit board (PCB) contained within the IHS.
Figure 4:
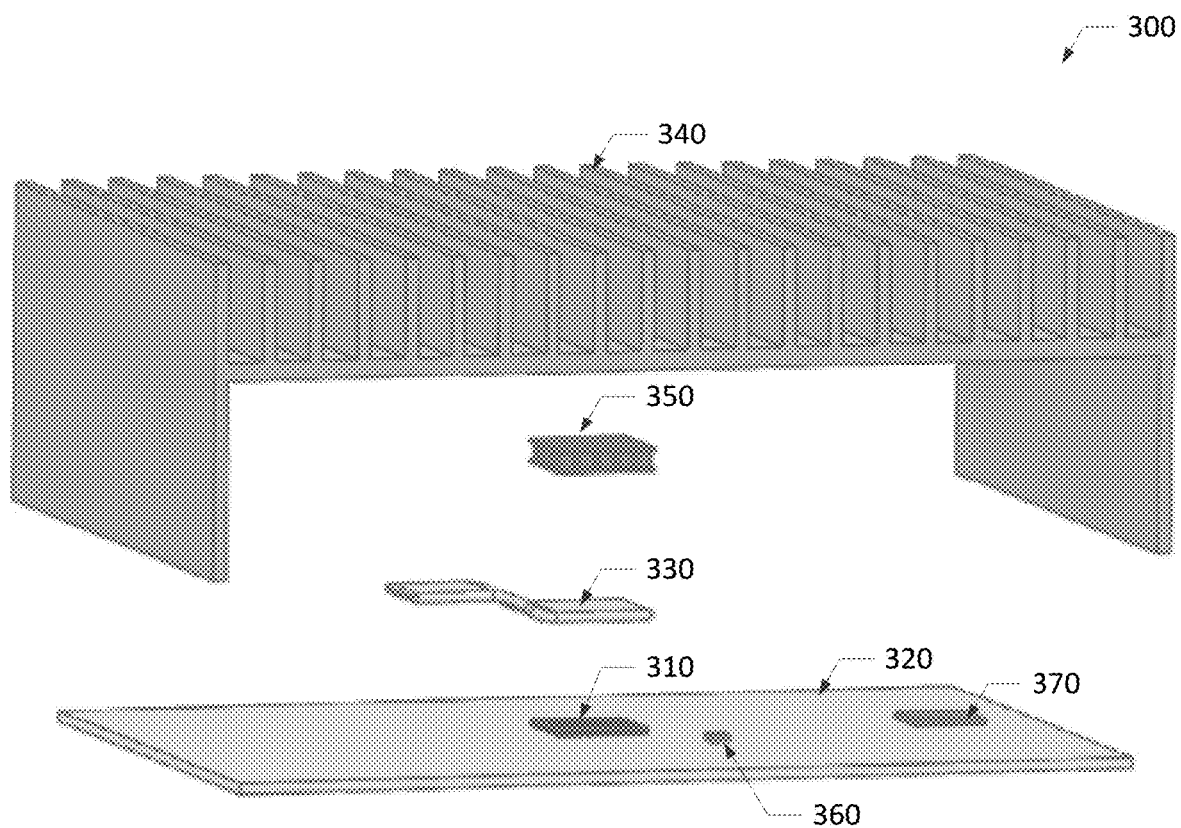
FIG. 4 is an exploded, three-dimensional (3D) view of the apparatus shown in FIG. 3.
Figure 5:
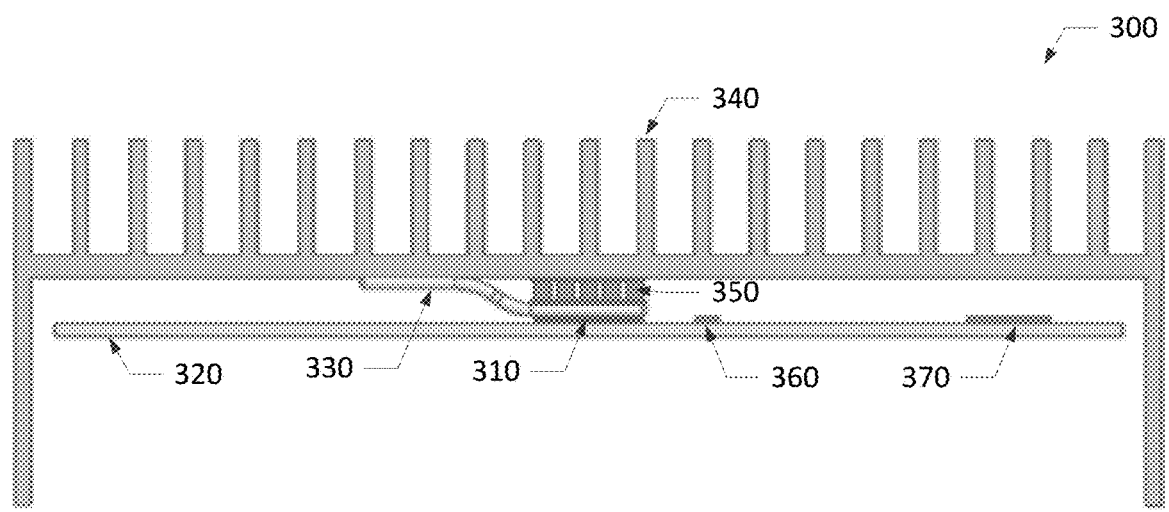
FIG. 5 is side view of the apparatus shown in FIG. 3.
Figure 6:
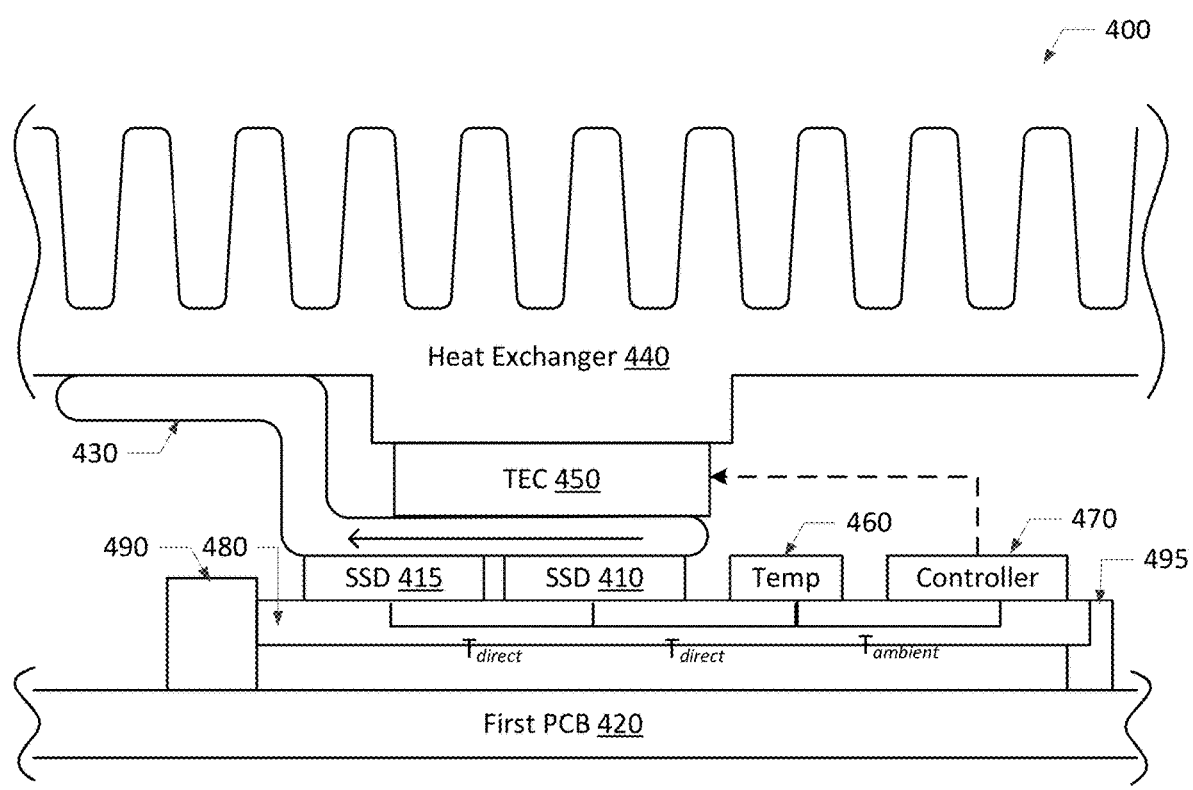
FIG. 6 is a block diagram illustrating another embodiment of an apparatus that may be included within an IHS to improve thermal management for a SSD, which is coupled to a second PCB mounted onto a first PCB, each contained within the IHS.
Figure 7:
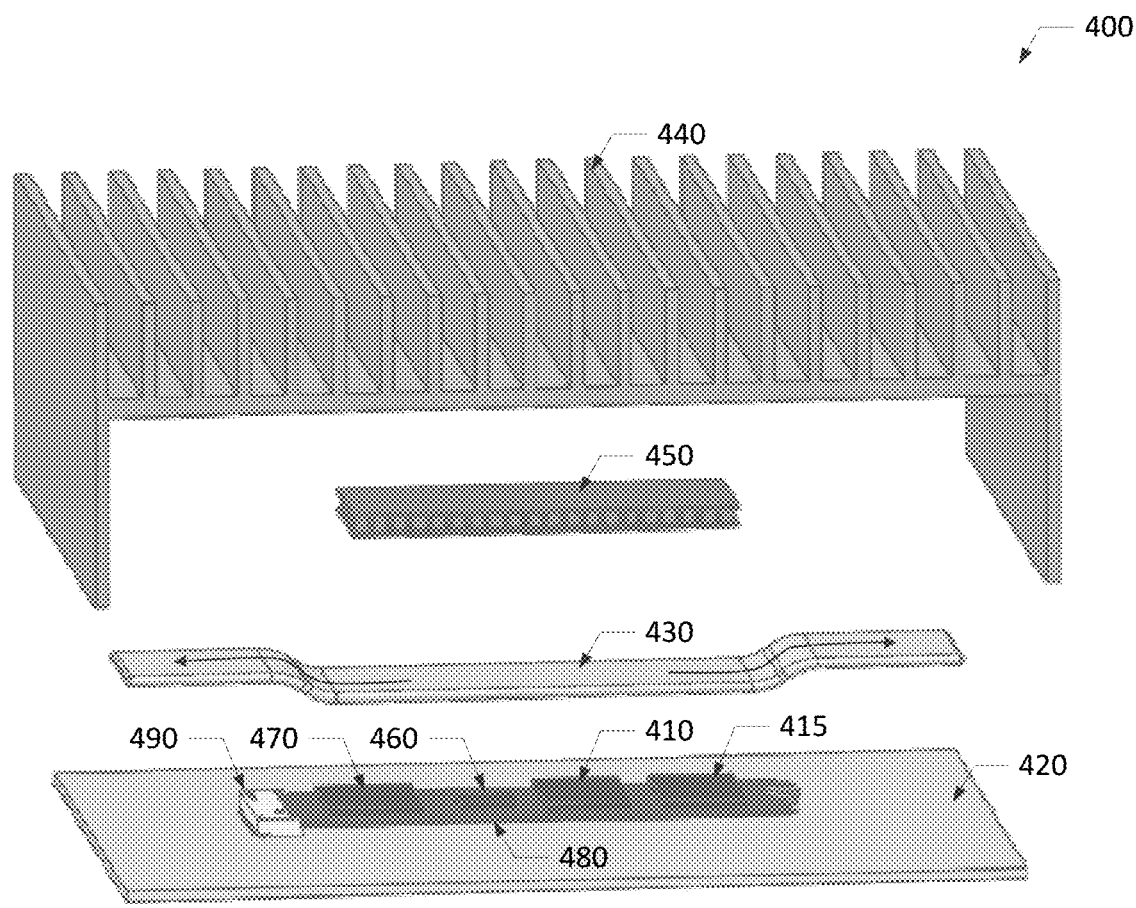
FIG. 7 is an exploded, three-dimensional (3D) view of the apparatus shown in FIG. 6.
Figure 8:
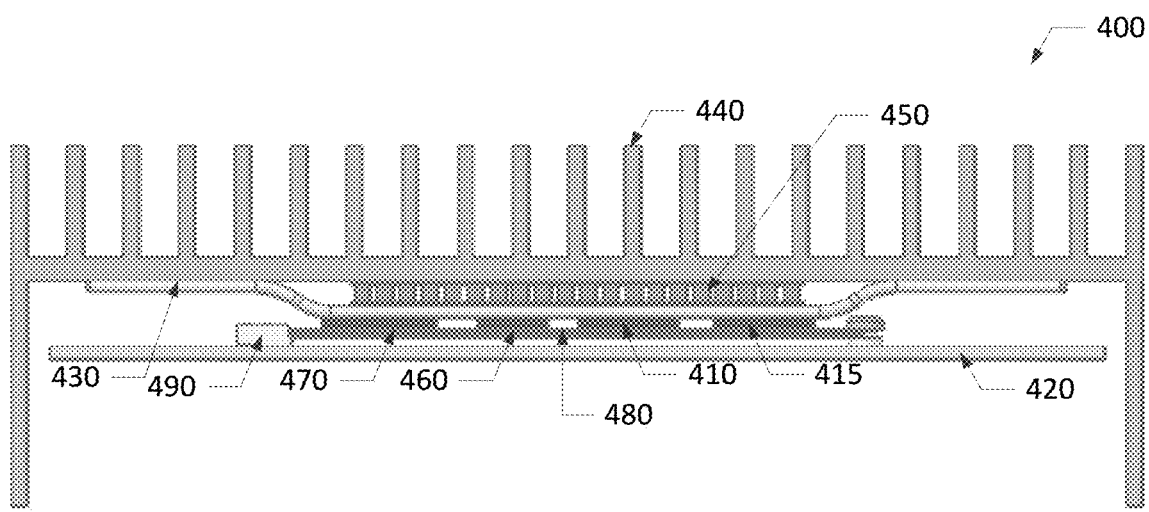
FIG. 8 is side view of the apparatus shown in FIG. 6.

Storage medium 170 may include any type of persistent, non-transitory computer readable storage medium, such as one or more hard disk drives (HDDs), optical drives, solid-state drives (SSDs), non-volatile RAM (NVRAM), Flash and/or any other suitable form of non-transitory computer readable storage media. In one embodiment, system storage 170 includes at least one solid-state drive (SSD), such as one or more NAND based SSDs. If included, SSD 170 may be mounted onto (or otherwise coupled to) a printed circuit board (PCB) contained within the IHS 100, and thus, may be contained within a housing or chassis of the IHS. In one embodiment, SSD 170 may be attached to a first PCB (e.g., a motherboard) contained within the IHS, as shown in FIGS. 3-5. In another embodiment, SSD 170 may be attached to a second PCB (e.g., an expansion card, such as an M.2 card), which is mounted onto a first PCB (e.g., a motherboard), each of which may be contained within the IHS, as shown in FIGS. 6-8. In some embodiments, SSD 170 may include an internal temperature sensor configured to directly measure a temperature of the SSD.

Network interface 180, which is coupled to PCH 150, enables IHS 100 to communicate with other devices, systems and/or services via one or more external networks. Network interface 180 may utilize one or more communication protocols to communicate signals and data to remotely located devices, systems and/or services via one or more external networks. The external networks may be local area networks (LANs), wide area networks (WANs), personal area networks (PANs), or the like, and the connection to and/or between IHS 100 and the external networks may be wired, wireless or a combination thereof.

Controller 190, which is coupled to PCH 150, may comprise hardware, software and/or firmware. In some embodiments, controller 190 may be an embedded controller (EC) or a dedicated microcontroller provided, for example, on a trusted platform of the IHS. Controller 190 is configured to execute program instructions (or computer program code), which may be stored within system memory 130 and/or storage medium 170. In some embodiments, controller 190 may be configured to execute program instructions associated with boot firmware 135 and/or OS 175. In some embodiments, controller 190 may execute additional program instructions to perform one or more steps of the thermal management method disclosed herein.

FIG. 2 illustrates another embodiment of an IHS 200 that may include embodiments of the apparatus disclosed herein to improve thermal management for one or more heat generating components contained within the IHS. The IHS 200 shown in FIG. 2 may be, for example, a network device (e.g., gateway, etc.) or an Internet of Things (IoT) device. While IHS 200 may not have the full functionality of IHS 100, IHS 200 may generally include at least one processing device (e.g., a CPU 110 and/or controller 190), at least one computer readable storage medium (e.g., system memory 130 and/or storage medium 170), and at least one interface (e.g., I/O ports 160 and/or network interface 180) for communicating with remotely located systems, devices or networks.

During operation of IHS 100/200, heat generated by one or more heat generating components, such as CPU 110, GPU 120, PCH 150 and/or SSD 170, may cause the heat generating components to over-heat. In conventional systems, one or more of the heat generating components (e.g., CPU 110, GPU 120, PCH 150 and/or SSD 170) may be thermally coupled to an active or passive heat sink, heat exchanger, heat spreader and/or active cooling unit to dissipate heat away from these components. A passive heat sink generally includes fins or other protrusions for dissipating heat, while an active heat sink comprises (or is coupled to) a cooling unit, such as a fan, to provide convective cooling to the heat sink. In some conventional systems, the heat generating components of the system may be thermally coupled to one or more heat pipes for conducting heat generated by the components to an active or passive heat sink.

A heat pipe is a closed evaporator-condenser system generally comprising a sealed, hollow tube, which is partially filled with a working fluid. In some heat pipes designs, the inside walls of the heat pipe may be lined with a capillary structure or wick. When heat is absorbed at the hot interface (i.e., the evaporator section) of the heat pipe, a portion of the working fluid vaporizes into a gas, which travels through the heat pipe to the cold interface (i.e., the condenser section) of the heat pipe, where it condenses back into a liquid—releasing the latent heat. In some heat pipes (referred to herein as "two-way heat pipes"), the condensed liquid is allowed to return to the hot interface of the heat pipe, e.g., via capillary action through the wick, and the cycle repeats.

Due to high heat transfer coefficients for evaporation and condensation, heat pipes are highly effective thermal conductors. However, when too much heat is applied to the evaporator section of a heat pipe, the working fluid within the heat pipe stops absorbing heat and heat pipe dry-out occurs. To avoid heat pipe dry-out, heat pipes are generally specified as having a maximum heat transportation limitation, $Q_{max}$, at the designated dry-out point. The $Q_{max}$ of a heat pipe (expressed in watts, W) is a function of the capillary limit, which is dependent on many factors including, but not limited to, heat pipe geometry (e.g., length, diameter, cross-sectional shape, etc.), type of working fluid, etc.

In conventional systems, the heat pipe is often designed to ensure that the maximum heat transportation limitation, $Q_{max}$, of the heat pipe is slightly greater than or equal to the Thermal Design Power (TDP) specified for the heat generating components thermally coupled to the heat pipe. Unfortunately, when a system is deployed in hot ambient environments (such as outdoors or inside a hot vehicle, storage cabinet, etc.), ambient temperatures within the system may rise and place significant strain on the heat transport capabilities of the heat pipe. This strain may be further exasperated when the heat pipe thickness is reduced (i.e., the heat pipe is flattened) to accommodate increasingly thinner information handling systems, since decreasing the heat pipe thickness reduces $Q_{max}$. In some cases, increasing temperatures within the IHS may cause the temperature of a heat generating component to exceed the maximum heat transportation limitation, $Q_{max}$, of the heat pipe. When this occurs, heat dry-out occurs and the heat pipe is no longer able to remove heat away from the heat generating components coupled to the heat pipe.

When operating an IHS in high external ambient temperatures (e.g., 70° C. and above), heat pipes, heat sinks and other passive cooling techniques may be unable to reduce the temperature of the heat generating component(s) below the maximum temperature rating specified for the component(s). Solid-state drives (SSDs) contained within some IHSs are particularly affected by high external ambient temperatures, due to the minimal thermal management typically afforded to such devices. The insufficient thermal management typically afforded to SSDs prevents these devices from operating at high external ambient temperatures that, in some cases, may extend up to the maximum temperature rating specified for these devices.

For example, many IHSs provide no thermal management to SSDs. While this solution is most common, SSDs without any kind of thermal management may only operate in external ambient temperatures up to about 35° C., which is far below the maximum temperature rating specified for the SSD (e.g., 85° C., in one embodiment). In other IHSs, a thermal pad may be coupled between an SSD and the motherboard PCB. Although a thermal pad may be used to transfer heat from the SSD to the PCB, it may only enable the SSD to operate in external ambient temperatures up to about 45° C. In other IHSs, an SSD may be thermally coupled to a heat sink and/or an external enclosure of an IHS. When combined with thermal throttling techniques, such an SSD may operate in external ambient temperatures up to about 70° C. However, no thermal management solutions have been proposed to date, which enable an SSD to operate in external ambient temperatures above 70° C., much less the maximum temperature rating specified for the SSD (e.g., 85° C., in one embodiment).

The present disclosure provides an improved thermal management solution (e.g., an apparatus and related methods) that enables heat generating component(s) of an information handling system to operate in high external ambient temperatures up to a maximum temperature rating specified for the heat generating component(s). According to one embodiment, the improved thermal management solution disclosed herein may enable a storage device, such as storage medium 170 of IHS 100/200, to support high external ambient temperatures up to the maximum temperature rating of the storage device. As noted above, storage medium 170 may be a solid-state drive (SSD), such as a NAND based SSD, which is mounted onto a printed circuit board (PCB) contained within the IHS 100/200. Although the solution disclosed herein is used to improve thermal management for storage devices, and more specifically, solid-state drives, it is contemplated that the same or similar solution could be used to reduce the temperature of other heat generating components (e.g., CPU 110, GPU 120, and/or PCH 150) contained within the IHS.

FIG. 3 is a simplified block diagram illustrating one embodiment of an apparatus 300 that may be included within an IHS (such as IHS 100/200) to provide improved thermal management for at least one solid-state drive (SSD) 310 contained therein. FIG. 4 is an exploded, three-dimensional (3D) view and FIG. 5 is side view of the apparatus 300 shown in FIG. 3. In the embodiment shown in FIGS. 3-5, an underside of SSD 310 is mounted onto (e.g., soldered) a first PCB 320 contained within the IHS. The first PCB 320 may be a motherboard or a system board upon which SSD 310 and other IHS components (e.g., one or more of CPU 110, GPU 120, system memory 130, network interface 180, controller 190, etc.) are mounted. As described in more detail below, one or more components (e.g., temperature sensor 360 and controller 370) of apparatus 300 may also be attached or mounted upon the first PCB 320.

Apparatus 300 may generally include a heat pipe 330, a heat exchanger 340, a thermoelectric cooler (TEC) 350, a temperature sensor (e.g., temperature sensor 360 or an internal temperature sensor provided within SSD 310) and a controller 370. Heat pipe 330 may be thermally coupled between one or more heat generating components of the IHS and heat exchanger 340 to transfer thermal energy (or heat) from the heat generating components to the heat exchanger. TEC 350 may be thermally coupled between heat pipe 330 and heat exchanger 340 to transfer excess thermal energy (or excess heat), which cannot be absorbed by the heat pipe, to the heat exchanger. Due to the poor power efficiency of TEC 350, however, embodiments of the thermal management solution described herein may disable or turn off the TEC when extra cooling is not needed.

For example, heat pipe 330 may be used as a primary thermal energy transfer device for the heat generating components when internal temperatures within the IHS are within a first temperature range, and TEC 350 may be used as a secondary thermal energy transfer device for the heat generating components when internal temperatures are within a second temperature range. As described in more detail below, the first and second temperature ranges may be generally depending on the configuration of heat pipe 330 and the particular heat generating components being cooled. In some embodiments, one or more heat generating components of the IHS may include an internal temperature sensor for directly measuring a temperature ($T_{direct}$) of the component(s). In other embodiments, an temperature sensor 360 coupled to a printed circuit board (PCB) may be configured to measure an internal ambient temperature ($T_{ambient}$) in the vicinity of the heat generating component(s). Controller 370 may be coupled to receive the internal temperature measurement ($T_{direct}$) directly measured from the heat generating component(s) or the internal ambient temperature measurement ($T_{ambient}$) from temperature sensor 360, and may be configured to enable/disable TEC 350 based on the received temperature measurement. For example, controller 370 may be configured to enable (or turn on) TEC 350 when internal temperatures are within the second temperature range, and disable (or turn off) the TEC when internal temperatures fall within the first temperature range, which is less than the second temperature range.

As used herein, the term "thermally coupled" means that thermal energy (or heat) is transferred from one component to another through a direct connection (such as when the heat generating components are in physical contact with the heat pipe) or an indirect connection (e.g., via conduction, convection or radiation of thermal energy). In the embodiment shown in FIGS. 3-5, heat pipe 330 is in direct physical contact with SSD 310 and heat exchanger 340 for directing heat away from the SSD to the heat exchanger. Likewise, TEC 350 is in direct physical contact with heat pipe 330 and heat exchanger 340 for directing excess heat that cannot be absorbed by heat pipe 330 (e.g., due to heat pipe dry-out) to the heat exchanger. As shown in FIGS. 3-5, heat pipe 330, TEC 350 and heat exchanger 340 are implemented in stacked configuration, with the TEC sandwiched between the heat pipe and the heat exchanger. In such an embodiment, heat pipe 330 may be configured with multiple bends to accommodate a thickness of the TEC.

It is noted that, although heat pipe 330 is illustrated in FIGS. 3-5 as thermally coupled to only one heat generating component (SSD 310), heat pipe 330 may be coupled to additional and/or alternative heat generating components (e.g., CPU 110, GPU 120, and/or PCH 150) provided on the first PCB 320 without departing from the scope of the present disclosure. It is further noted that, although a single heat generating component (SSD 310) is illustrated in FIGS. 3-5, the thermal management solution disclosed herein is not strictly limited to such, and may generally function as described herein for transferring thermal energy away from one or more heat generating components. Furthermore, although heat pipe 330 is illustrated in FIGS. 3-5 as a flattened length of pipe with multiple bends, heat pipe 330 is not restricted to such a configuration, and may comprise any geometry and/or configuration needed to meet the thermal management needs of the attached heat generating component(s).

Heat pipe 330 may generally include an evaporator section, a condenser section and an adiabatic section. In the embodiment shown in FIGS. 3-5, the evaporator section of heat pipe 330 is in direct physical contact with a top side of SSD 310, while the condenser section is in direct physical contact with heat exchanger 340. Heat absorbed by the evaporator section vaporizes a portion of the working fluid contained within heat pipe 330 into a gas, which travels through the adiabatic section to the condenser section, where the gas condenses back into a liquid to release the latent heat into heat exchanger 340. Unlike other heat pipes, which may be configured to transfer thermal energy (or heat) in two directions, heat pipe 330 is specifically configured to transfer thermal energy in only one direction (i.e., from the evaporator section to the condenser section), and thus, may be referred to herein as a one-way heat pipe. Configuring heat pipe 330 as a one-way heat pipe prevents thermal energy, which may be transferred into heat exchanger 340 via TEC 350, from returning through the heat pipe to the heat generating component(s) coupled thereto.

One example of a one-way heat pipe that may be used herein is disclosed in co-pending U.S. patent application Ser. No. 15/909,014, which is entitled "System and Method for Transferring Energy," filed on Mar. 1, 2018 and incorporated herein in its entirety. The co-pending patent application discloses a one-way heat pipe, which includes a Tesla valve and a wicking structure. The Tesla valve enables fluid in a vapor state to move in a first direction (e.g., from the evaporator section to the condenser section), while the wicking structure enables fluid in a liquid state to move in a second direction opposite to the first direction (e.g., from the condenser section to the evaporator section). The Tesla valve and wicking structure included within the one-way heat pipe ensures that fluid in the vapor state moves with much less resistance in the first direction than liquid fluid is able to move in the second direction. This enables the one-way heat pipe described in the co-pending patent application to mitigate or substantially eliminate thermal energy flow in the second direction. When heat pipe 330 is configured as a one-way heat pipe, such as but not limited to the heat pipe configuration disclosed in the co-pending patent application, it prevents thermal energy that may be transferred into heat exchanger 340 via TEC 350 from returning through the heat pipe to SSD 310.

Thermoelectric coolers (TECs) operate by the Peltier effect (otherwise referred to as the thermoelectric effect). A TEC device has two sides, and when electric current flows through the device, it brings heat from one side of the device to the other, so that one side gets cooler while the other gets hotter. In the embodiment shown in FIGS. 3-5, the "cool" side of TEC 350 is in direct physical contact with the evaporator section of heat pipe 330, and the "hot" side of TEC 350 is in direct physical contact with heat exchanger 340. When a voltage is applied to TEC 350, current flow across the junction of semiconductors sandwiched between the two sides of the TEC causes a temperature difference between the hot and cools sides of the TEC. The temperature difference between the hot and cools sides of the TEC may be approximately 20° C. (or more), in one embodiment. As described in more detail below, the temperature differential across the TEC may enable the heat generating component(s) to function even when external ambient temperatures (i.e., ambient temperatures outside of the IHS) reach the maximum temperature rating specified for the heat generating component.

Excess heat from heat pipe 330 is absorbed by the cool side of the TEC and transferred through the hot side of the TEC to heat exchanger 340. The more heat moved through the TEC, the less efficient it becomes, because the TEC needs to dissipate both the heat being moved and the heat it generates from its own power consumption. For this reason, it may be desirable to enable (or turn on) TEC 350 only when internal ambient temperatures are within a second temperature range, and disable (or turn off) the TEC when internal ambient temperatures fall within a first temperature range, which is less than the second temperature range.

In one embodiment, the first temperature range may generally include a range of temperatures that can be absorbed by heat pipe 330 before the TEC 350 is turned on to transfer excess heat away from the heat generating components. The first temperature range may be generally dependent on the particular heat pipe configuration. In one embodiment, the first temperature range may include a range of internal temperatures (e.g., temperatures measured directly from the heat generating components, or ambient temperatures measured within the IHS in the vicinity of the heat generating components) below approximately 70° C. It is noted, however, that the upper limit of the first temperature range is not limited to 70° C., and may include other temperatures in other embodiments.

The second temperature range may generally include a range of temperatures above the first temperature range. In one embodiment, the second temperature range may include a range of internal temperatures greater than the upper limit of the first temperature range. In another embodiment, the second temperature range may extend from an upper limit of the first temperature range up to a thermal throttle temperature rating specified for the heat generating component(s), if the heat generating component(s) support thermal throttling. In another embodiment, the second temperature range may extend from an upper limit of the first temperature range up to a maximum temperature rating specified for the heat generating component(s). In another embodiment, the second temperature range may include internal temperatures that exceed the maximum temperature rating by approximately the temperature differential provided by TEC 350. For example, the second temperature range may include internal temperatures that extend from the upper limit of the first temperature range up to a temperature, which substantially equals to the maximum temperature rating specified for the heat generating component plus the temperature differential provided by the TEC.

For example, some NAND-based SSDs have a maximum temperature rating of approximately 85° C. When the apparatus disclosed herein is used to cool such SSDs, TEC 350 may be disabled (or turned off) and heat pipe 330 may be used to transfer heat away from the SSD when an internal temperature measurement falls within a first temperature range (e.g., below approximately 70° C.). On the other hand, TEC 350 may be enabled (or turned on) to transfer excess heat away from the SSD when the internal temperature measurement is within a second temperature range, which is greater than the first temperature range. In one preferred embodiment, the second temperature range extend from an upper limit of the first temperature range (e.g., approximately 70° C.) up to a maximum temperature rating (e.g., approximately 85° C.) specified for the SSD. In another preferred embodiment, the second temperature range extend from an upper limit of the first temperature range (e.g., approximately 70° C.) up to a temperature (e.g., approximately 105° C.), which substantially equals the maximum temperature rating (e.g., approximately 85° C.) specified for the SSD plus the temperature differential (e.g., approximately 20° C.) provided by the TEC.

It is noted that while example first and second temperature ranges are provided herein for certain NAND-based SSDs, the temperature ranges are generally dependent on the heat pipe configuration and the particular heat generating component(s) the apparatus disclosed herein is being used to cool. Accordingly, one skilled in the art would readily understand how the first and second temperature ranges may differ for different heat pipe configurations and heat generating components.

By enabling TEC 350 to remove excess heat from the heat generating component(s) when internal temperatures (i.e., temperatures measured directly from the heat generating components or ambient temperatures measured inside of the IHS) are within the second temperature range, the apparatus disclosed herein enables the heat generating component(s) to function even if external ambient temperatures (i.e., ambient temperatures outside of the IHS) reach as high as the maximum temperature rating specified for the heat generating component(s). By disabling TEC 350 when internal temperatures fall within the first temperature range, the apparatus disclosed herein decreases power consumption and increases power efficiency of the apparatus by allowing heat pipe 330 to draw heat away from the heat generating component(s).

In some embodiments, heat generating components (such as one or more of CPU 110, GPU 120, PCH 150, and storage medium 170) may include an internal temperature sensor for directly measuring a temperature of the component. In other embodiments, a temperature sensor 360 coupled to a printed circuit board (PCB) may be configured to measure the internal ambient temperature ($T_{ambient}$) within the IHS in the vicinity of the heat generating component(s). In the embodiments shown in FIGS. 3-5, for example, temperature sensor 360 is mounted onto (or otherwise coupled to) the first PCB 320 in the vicinity of SSD 310 to measure the internal ambient temperature. However, SSD 310 could alternatively include a temperature sensor within its housing or enclosure for directly measuring the temperature thereof. Substantially any suitable type of temperature sensor may be used including, but not limited to, thermistors, diodes, and thermocouples to name a few.

Controller 370 is coupled to receive the internal temperature measurement ($T_{direct}$) directly measured from the heat generating component (e.g., SSD 310) or the internal ambient temperature ($T_{ambient}$) measurement from temperature sensor 360. In addition, controller 370 is configured to monitor the received temperature measurement, and enable/disable TEC 350 based on the received temperature measurement. For example, controller 370 may be configured to enable (or turn on) TEC 350 when the received temperature measurement is within a second temperature range, and disable (or turn off) the TEC when the received temperature measurement falls within a first temperature range, which is less than the second temperature range. It is noted that, although first and second temperature ranges are discussed above for certain NAND-based SSDs, controller 270 may be configured to enable/disable TEC 350 when internal temperature measurements fall within substantially any first and second temperature ranges, as long as the first temperature range is less than the second temperature range.

Regardless of the temperature ranges used to determine when to enable/disable the TEC, controller 370 may be coupled to power circuitry within the TEC to turn the TEC on/off. When TEC 350 is enabled by controller 370, the power circuitry may apply a voltage to the TEC, which causes current to flow across the junction of the semiconductors sandwiched between the hot and cool sides of the TEC, thereby creating a temperature difference between the hot and cools sides of the TEC. As noted above, the temperature difference (e.g., approximately 20° C. or more) provided by TEC 350 may enable the heat generating component(s) to function even when external ambient temperatures (i.e., ambient temperatures outside of the IHS) reach the maximum temperature rating specified for the heat generating component(s). When TEC 350 is disabled by controller 370, the power circuitry may remove the voltage applied to the TEC.

In the embodiment shown in FIGS. 3-5, controller 370 is mounted onto (or otherwise coupled to) the first PCB 320. In some embodiments, controller 370 may be controller 190 (e.g., an embedded controller or microcontroller), which is included within the information handling systems 100/200 embodiments shown in FIGS. 1 and 2. However, controller 370 is not limited to such an implementation and may be alternatively implemented as a processing device (e.g., CPU 110) executing boot firmware 135 or an OS driver. Regardless of implementation and placement, controller 370 may be configured to execute program instructions (or computer program code) for performing the functionality discussed above. The program instructions may be stored within controller 370, or alternatively, within a non-volatile computer readable storage medium, such as system memory 130 or storage medium 170.

FIG. 6 is a simplified block diagram illustrating another embodiment of an apparatus 400 that may be included within an IHS (such as IHS 100/200) to provide improved thermal management for at least one solid-state drive (SSD) 410/420 contained therein. FIG. 7 is an exploded, three-dimensional (3D) view and FIG. 8 is side view of the apparatus 400 shown in FIG. 6. In the embodiments shown in FIGS. 6-8, a plurality of SSDs 410/415 are attached to a second PCB 480, which is coupled or mounted onto the first PCB 420. As noted above, the first PCB 420 may be a motherboard or system board upon which certain IHS components (e.g., one or more of CPU 110, GPU 120, system memory 130, network interface 180 and controller 190, etc.) are mounted.

Second PCB 480 may be an expansion card, which is mounted onto (or otherwise coupled to) the first PCB 420. According to one embodiment, the second PCB 480 may be an M.2 card or module having a plurality of SSDs 410/415, an optional temperature sensor 460 and a controller 470 mounted thereon. Although not specifically shown in FIGS. 6-8, the second PCB 480 may include edge connectors for coupling or mating with a mating connector 490 (e.g., an M.2 socket) provided on the first PCB 420. To secure the second PCB 480 to the first PCB 420, a screw (or other mechanical fastener) may be threaded through a mounting hole on an opposing edge of the second PCB 480 to engage with a mounting post 495 provided on the first PCB 420.

In some embodiments, apparatus 400 may be substantially identical to the apparatus 300 shown in FIGS. 3-5 with the exception of the placement of apparatus 400 on the second PCB 480 as opposed to the first PCB 420. As such, apparatus 400 may generally include a heat pipe 430, a heat exchanger 440, a thermoelectric cooler (TEC) 450, a temperature sensor (e.g., temperature sensor 460 or an internal temperature sensor provided within SSDS 410/415) and a controller 470, each of which may be coupled and configured as described above.

In the embodiment shown in FIGS. 6-8, heat pipe 430 is thermally coupled between a pair of SSDs 410/415 and heat exchanger 440 to transfer thermal energy (or heat) away from the SSDs to the heat exchanger. TEC 450 is thermally coupled between heat pipe 430 and heat exchanger 440 to transfer excess thermal energy (or excess heat), which cannot be absorbed by the heat pipe, to the heat exchanger.

As noted above, heat pipe 430 may be used as a primary thermal energy transfer device for transferring heat away from SSDs 410/415 when internal temperatures (measured directly from or in the vicinity of the SSDs) fall within a first temperature range. TEC 450, on the other hand, may be used as a secondary thermal energy transfer device for transferring excess heat away from SSDs 410/415 when internal temperatures are within a second temperature range, which is greater than the first temperature range. In some embodiments, SSDs 410/415 may each include an internal temperature sensor for directly measuring a temperature ($T_{direct}$) of the SSDs. In other embodiments, an additional temperature sensor 460 may be coupled to the second PCB 480 and configured to measure an internal ambient temperature ($T_{ambient}$) in the vicinity of SSDs 410/415. Controller 470 may be coupled to receive the internal temperature measurement ($T_{direct}$) directly measured from the SSDs 410/415 or the internal ambient temperature measurement ($T_{ambient}$) received from the temperature sensor 460, and may use the received temperature measurement to enable/disable TEC 450. As noted above, controller 470 may enable (or turn on) TEC 450 when internal temperature measurements are within the second temperature range, and disable (or turn off) the TEC when internal temperature measurements fall within the first temperature range. The first and second temperature ranges may generally be configured as described above.

By enabling TEC 450 to remove excess heat when internal temperatures (i.e., temperatures measured directly from the SSDs or ambient temperatures measured inside the IHS) are within the second (higher) temperature range, apparatus 400 may enable SSDs 410/415 to function even when external ambient temperatures (i.e., ambient temperatures outside of the IHS) are as high as the maximum temperature rating specified for the SSDs (e.g., 85° C., in on embodiment). By disabling TEC 450 when internal temperatures fall within the first temperature range, apparatus 400 decreases power consumption and increases power efficiency of the apparatus by allowing heat pipe 430 to draw heat away from the SSDs. As noted above, heat pipe 430 is preferrably configured as a one-way heat pipe to prevent thermal energy, which is transferred into heat exchanger 440 via TEC 450, from returning through the heat pipe to SSDs 410/415.

Figure 9:
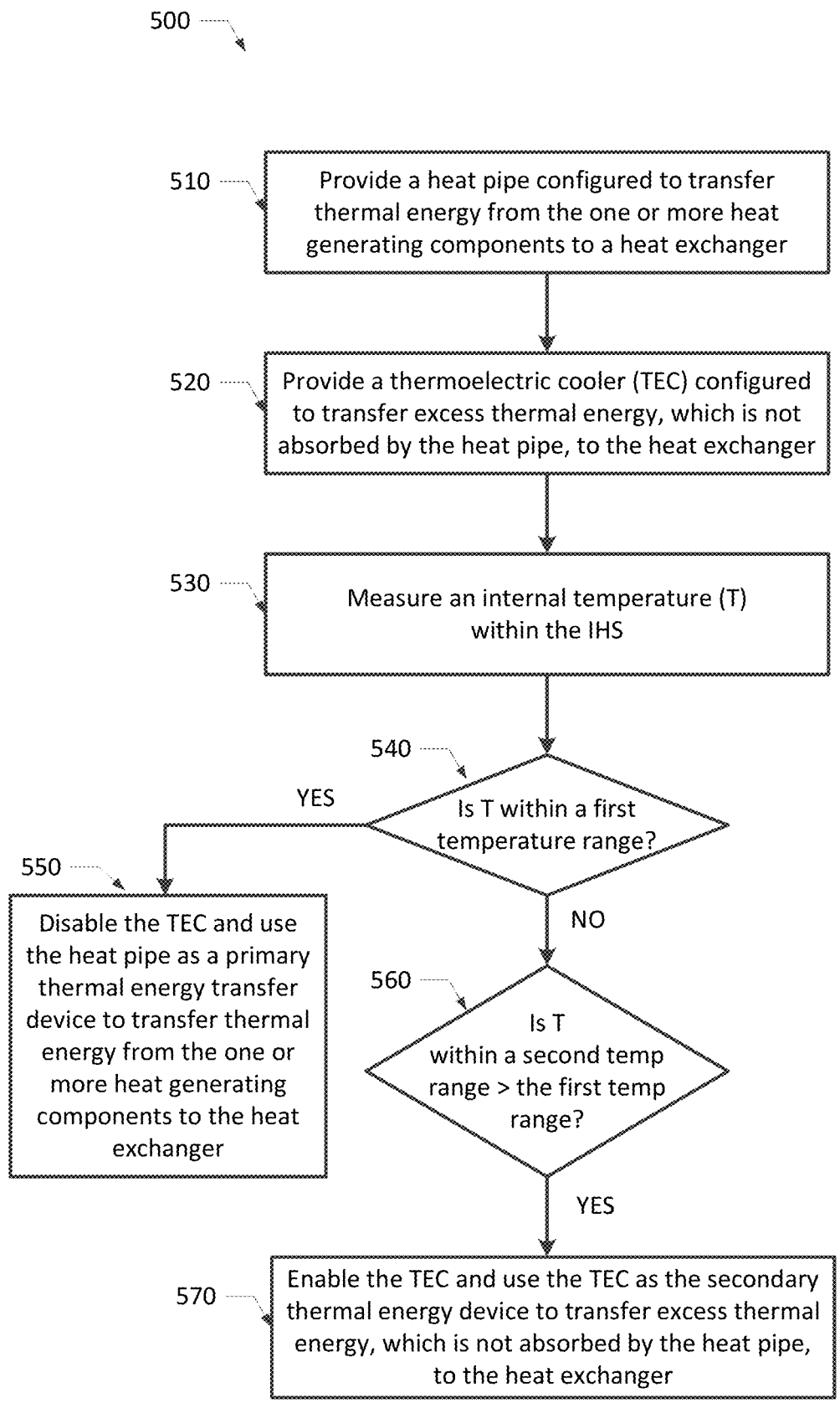
FIG. 9 is a flowchart diagram illustrating one embodiment of a thermal management method for one or more heat generating components of an IHS.

FIG. 9 is a flowchart diagram illustrating one embodiment of a thermal management method 500 for one or more heat generating components of an information handling system. In some embodiments, method 500 may begin by providing a heat pipe configured to transfer thermal energy from the one or more heat generating components to a heat exchanger (in step 510) and providing a thermoelectric cooler (TEC) configured to transfer excess thermal energy, which is not absorbed by the heat pipe, to the heat exchanger (in step 520). Next, method 500 may measure an internal temperature within the IHS (in step 530) and enable/disable the TEC based on the internal temperature measurement. The internal temperature may be a temperature ($T_{direct}$) directly measured from the heat generating component(s) or an internal ambient temperature ($T_{ambient}$) measured within the IHS in a vicinity of the heat generating component(s).

For example, if method 500 determines that the internal temperature (T) is within a first temperature range (YES branch of step 540), the method may disable the TEC and use the heat pipe as a primary thermal energy transfer device to transfer thermal energy from the one or more heat generating components to the heat exchanger (in step 550). On the other hand, if method 500 determines that the internal temperature (T) is within a second temperature range greater than the first temperature range (NO branch of step 540 and YES branch of step 560), the method may enable the TEC and use the TEC as the secondary thermal energy transfer device to transfer excess thermal energy, which is not absorbed by the heat pipe, to the heat exchanger (in step 570).

It will be understood that one or more of the tasks, functions, or methodologies described herein may be implemented, for example, as firmware or as a computer program of instructions embodied in a non-transitory tangible computer readable medium that is executed by a CPU, controller, microcontroller, processor, microprocessor, FPGA, ASIC, or other suitable processing device. In one embodiment, for example, one or more steps (e.g., steps 540-570) of the method 500 shown in FIG. 9 may be implemented as program instructions, which are stored within a non-transitory tangible computer readable medium (e.g., system memory 130 or storage medium 170) that is executed by a controller (e.g., controller 190, controller 370 or controller 470) or a processing device (e.g., CPU 110). When executed by a processing device, the program instructions may be implemented as boot firmware or an OS driver.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus, the invention is not limited to only those combinations shown herein, but rather may include other combinations.

What is claimed is:
1. An apparatus configured to improve thermal management for one or more heat generating components included within an information handling system (IHS), the apparatus comprising:

a heat exchanger;
a heat pipe thermally coupled between the one or more heat generating components and the heat exchanger to transfer thermal energy from the one or more heat generating components to the heat exchanger, wherein an evaporator section of the heat pipe is in direct physical contact with the one or more heat generating components and a condenser section of the heat pipe is in direct physical contact with heat exchanger;
a thermoelectric cooler (TEC) thermally coupled between the heat pipe and the heat exchanger to transfer excess thermal energy that is not absorbed by the heat pipe to the heat exchanger;
a temperature sensor configured to measure an internal temperature within the IHS; and
a controller coupled to receive the internal temperature measurement from the temperature sensor and configured to enable and disable the TEC based on the received temperature measurement.

2. The apparatus as recited in claim 1, wherein the controller is configured to enable the TEC when the received temperature measurement is within a second temperature range, and disable the TEC when the received temperature measurement is within a first temperature range, which is less than the second temperature range.

3. An apparatus configured to improve thermal management for one or more heat generating components within an information handling system (IHS), the apparatus comprising:
a heat pipe thermally coupled between one or more heat generating components of the IHS and a heat exchanger to transfer thermal energy from the one or more heat generating components to the heat exchanger;
a thermoelectric cooler (TEC) thermally coupled between the heat pipe and the heat exchanger to transfer excess thermal energy that is not absorbed by the heat pipe to the heat exchanger;
a temperature sensor configured to measure an internal temperature within the IHS; and
a controller coupled to receive the internal temperature measurement from the temperature sensor and configured to enable and disable the TEC based on the received temperature measurement;
wherein an evaporator section of the heat pipe is in direct physical contact with the one or more heat generating components, wherein a condenser section of the heat pipe is in direct physical contact with heat exchanger, and wherein the heat pipe is configured to transfer thermal energy in only one direction, from the evaporator section to the condenser section of the heat pipe, and prevent thermal energy from the heat exchanger from returning through the heat pipe to the one or more heat generating components.

4. An apparatus configured to improve thermal management for one or more heat generating components within an information handling system (IHS), the apparatus comprising:
a heat pipe thermally coupled between one or more heat generating components of the IHS and a heat exchanger to transfer thermal energy from the one or more heat generating components to the heat exchanger;
a thermoelectric cooler (TEC) thermally coupled between the heat pipe and the heat exchanger to transfer excess thermal energy that is not absorbed by the heat pipe to the heat exchanger;
a temperature sensor configured to measure an internal temperature within the IHS; and
a controller coupled to receive the internal temperature measurement from the temperature sensor and configured to enable and disable the TEC based on the received temperature measurement;
wherein a cool side of the TEC is in direct physical contact with an evaporator section of the heat pipe, and a hot side of the TEC is in direct physical contact with the heat exchanger.

5. An apparatus configured to improve thermal management for one or more heat generating components within an information handling system (IHS), the apparatus comprising:
a heat pipe thermally coupled between one or more heat generating components of the IHS and a heat exchanger to transfer thermal energy from the one or more heat generating components to the heat exchanger;
a thermoelectric cooler (TEC) thermally coupled between the heat pipe and the heat exchanger to transfer excess thermal energy that is not absorbed by the heat pipe to the heat exchanger;
a temperature sensor configured to measure an internal temperature within the IHS; and
a controller coupled to receive the internal temperature measurement from the temperature sensor and configured to enable and disable the TEC based on the received temperature measurement;
wherein the heat pipe, the TEC and the heat exchanger are implemented in a stacked configuration, and wherein the heat pipe is configured with multiple bends to accommodate a thickness of the TEC.

6. The apparatus as recited in claim 1, wherein the temperature sensor is coupled to a printed circuit board (PCB) included within the IHS and configured to measure an internal ambient temperature in a vicinity of the one or more heat generating components.

7. The apparatus as recited in claim 1, wherein the temperature sensor is included within the one or more heat generating components and configured to directly measure a temperature of the one or more heat generating components.

8. The apparatus as recited in claim 1, wherein the one or more heat generating components and the controller are coupled to a first printed circuit board (PCB) included within the IHS.

9. The apparatus as recited in claim 1, wherein the one or more heat generating components and the controller are coupled to a second PCB, which in turn, is coupled to a first PCB, each included within the IHS.

10. The apparatus as recited in claim 9, wherein the first PCB is a motherboard of the IHS, and wherein the second PCB is an M.2 card coupled to the motherboard.

11. The apparatus as recited in claim 1, wherein the one or more heat generating components comprise one or more solid-state drives (SSDs).

12. A thermal management method for one or more heat generating components of an information handling system (IHS), the method comprising:
providing a heat pipe configured to transfer thermal energy from the one or more heat generating components to a heat exchanger;
providing a thermoelectric cooler (TEC) configured to transfer excess thermal energy, which is not absorbed by the heat pipe, to the heat exchanger;
measuring an internal temperature within the IHS; and
enabling and disabling the TEC based on the internal temperature measurement, wherein said enabling and disabling comprises:

turning the TEC on when the internal temperature measurement is within a second temperature range, so that both the TEC and the heat pipe transfer thermal energy from the one or more heat generating components to the heat exchanger; and turning the TEC off when the internal temperature measurement is within a first temperature range, which is less than the second temperature range, so that only the heat pipe transfers thermal energy from the one or more heat generating components to the heat exchanger.

13. The thermal management method as recited in claim 12, wherein said enabling the TEC comprises turning the TEC on by applying a voltage to the TEC, and wherein said disabling the TEC comprises turning the TEC off by removing the voltage applied to the TEC.

14. The thermal management method as recited in claim 12, wherein the first temperature range includes a range of temperatures that can be absorbed by the heat pipe, and wherein the second temperature range includes a range of temperatures that extend from an upper limit of the first temperature range to at least a maximum temperature rating specified for the one or more heat generating components.

15. The thermal management method as recited in claim 14, wherein the second temperature range includes a range of temperatures that extend from an upper limit of the first temperature range to a temperature substantially equal to the maximum temperature rating specified for the one or more heat generating components plus a temperature differential provided by the TEC.

16. An information handling system (IHS), comprising:
one or more heat generating components;
an apparatus coupled to improve thermal management for the one or more heat generating components, the apparatus comprising:
a heat exchanger;
a heat pipe thermally coupled between the one or more heat generating components and the heat exchanger to transfer thermal energy from the one or more heat generating components to the heat exchanger, wherein an evaporator section of the heat pipe is in direct physical contact with the one or more heat generating components and a condenser section of the heat pipe is in direct physical contact with heat exchanger;
a thermoelectric cooler (TEC) thermally coupled between the heat pipe and the heat exchanger to transfer excess thermal energy that is not absorbed by the heat pipe to the heat exchanger;
a temperature sensor configured to measure an internal temperature within the IHS; and
a controller coupled to receive the internal temperature measurement from the temperature sensor and configured to enable and disable the TEC based on the received temperature measurement.

17. The information handling system as recited in claim 16, wherein the controller is configured to enable the TEC when the received temperature measurement is within a second temperature range, and disable the TEC when the received temperature measurement is within a first temperature range, which is less than the second temperature range.

18. The information handling system as recited in claim 16, wherein the heat pipe is configured to transfer thermal energy in only one direction, from an evaporator section to a condenser section of the heat pipe, and prevent thermal energy from the heat exchanger from returning through the heat pipe to the one or more heat generating components.

19. The information handling system as recited in claim 16, wherein the temperature sensor is coupled to a printed circuit board (PCB) included within the IHS and configured to measure an internal ambient temperature in a vicinity of the one or more heat generating components.

20. The information handling system as recited in claim 16, wherein the temperature sensor is included within the one or more heat generating components and configured to directly measure a temperature of the one or more heat generating components.

21. The information handling system as recited in claim 16, wherein the one or more heat generating components and the controller are coupled to a first printed circuit board (PCB) included within the IHS.

22. The information handling system as recited in claim 16, wherein the one or more heat generating components and the controller are coupled to a second PCB, which in turn, is coupled to a first PCB, each included within the IHS.

23. The information handling system as recited in claim 16, wherein the one or more heat generating components comprise one or more of the following: a solid-state drive (SSD), a processing device and a platform controller hub (PCH).

\* \* \* \* \*